(12) United States Patent
Fukuhisa et al.

(10) Patent No.: US 6,718,496 B1
(45) Date of Patent: Apr. 6, 2004

(54) SELF-REPAIRING SEMICONDUCTOR DEVICE HAVING A TESTING UNIT FOR TESTING UNDER VARIOUS OPERATING CONDITIONS

(75) Inventors: Hiroto Fukuhisa, Yokohama (JP); Yukihiro Urakawa, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/527,597

(22) Filed: Mar. 17, 2000

(30) Foreign Application Priority Data

Mar. 18, 1999 (JP) .......................................... 11-073917

(51) Int. Cl.[7] ............................................. G01R 31/28
(52) U.S. Cl. ...................................... 714/733; 714/734
(58) Field of Search ................................ 365/200, 201; 714/711, 7, 733, 734, 728

(56) References Cited

U.S. PATENT DOCUMENTS

| 5,987,632 A | * 11/1999 | Irrinki et al. | 365/201 |
| 6,067,262 A | * 5/2000 | Irrinki et al. | 365/200 |
| 6,166,562 A | 12/2000 | Mita et al. | |
| 6,367,042 B1 | * 4/2002 | Phan et al. | 714/733 |

OTHER PUBLICATIONS

Sawada, K., et al., *Built–in Self–Repair Circuit for High–Density ASMIC*, IEEE 1989 Custom Integrated Circuits Conference, pp. 26.1.1.–26.1.4. (Jun. 1989).

Kuroda, T., et al., *Variable Supply–Voltage Scheme for Lo–Power High–Speed CMOS Digital Design*, IEEE Journal of Solid–State Circuits, vol. 33, No. 3, pp. 454–461 (Mar. 1998).

* cited by examiner

*Primary Examiner*—Albert DeCady
*Assistant Examiner*—Mujtaba Chaudry
(74) *Attorney, Agent, or Firm*—Finnegan, Henderson, Farabow, Garrett & Dunner, L.L.P.

(57) ABSTRACT

A semiconductor device is provided having an internal circuit to be tested, a redundancy circuit used when detecting a defective part in the internal circuit, and a switching unit connected to the internal circuit and the redundancy circuit. The switching unit switches wiring in order to ensure proper operation of the semiconductor. A test unit is connected to the internal circuit for testing for the internal circuit. An operation environment change unit is connected to the internal circuit, wherein for changing an environment of the internal circuit when during testing. According to the present invention, testing of semiconductor devices can be performed under an actual environment so that a defective part can be detected under the actual operation environment. Moreover, it is possible to widen the range of guaranteed operation of semiconductor devices when a plurality of tests are performed under a plurality of operation environments.

21 Claims, 8 Drawing Sheets

Prior Art

SELF-REPAIRING SEMICONDUCTOR DEVICE HAVING A TESTING UNIT FOR TESTING UNDER VARIOUS OPERATING CONDITIONS

CROSS REFERENCE TO RELATED APPLICATIONS

This application claims benefit of priority under 35 USC 119 based on Japanese patent application P11-073917 filed Mar. 18, 1999, the entire contents of which are incorporated by reference herein. In addition, the entire contents of U.S. application Ser. No. 09030737 filed Feb. 25, 1998 are incorporated by reference herein.

BACKGROUND OF THE INVENTION

1. Field of the Invention

This invention is related to a semiconductor device having a self-repairing function.

2. Description of Related Art

Semiconductor devices, such as LSI devices, are often built with a self-repairing function, referred to as BISR (Built-In Self Repair). BISR repairs a defective part, improving the yield of semiconductor devices, by replacing the defective part with a redundancy circuit when the defective portion is detected in the semiconductor device by a self test function, BIST (Built-In Self Testing).

The function of BISR is explained herein with reference to a memory chip. BISR involves BIST, and the function of self-repairing is described in the following description.

FIG. 1 is a block diagram of a column cell array connected with a memory cell array in a memory chip. Each column cell in the column cell array is arranged corresponding to each memory cell in the memory cell array (not illustrated). Column cells A through D are shown in FIG. 1. Each column cell comprises a column selector (Column Sel) 101, a sense amplifier (S/A) 102, a multiplexer (MUX) 103, a BIST/BISR circuit (BIST/BISR) 104, a fuse (Fuse) 105, an addition circuit (Add.) 106, and an AND circuit 107. A redundancy column cell R, which replaces a defective portion, is also connected to the column cell array.

In the event BIST/BISR circuit 104 detects column cell B to be a defective part, fuse 105 of column cell B is blown out and MUX 103 of column cell B selects an output of S/A 102, in column cell C, by inputting a signal (sel) outputted by AND circuit 107 in column cell B. Similarly, the MUX 103 of column cell C selects an output of S/A 102 from column cell D by inputting a signal (sel) outputted by AND circuit 107 in column cell C. The MUX 103 of column cell D selects an output of S/A 102 of the redundancy column cell R by inputting a signal (sel) outputted by AND circuit 107 of column cell D. By switching the output of a defective column cell to the output of a neighboring column cell and then shifting in order, column cells A–D can operate properly.

Typically, as in the above example, testing is performed within a startup environment. However, such an environment is different from the actual operation environment. In an actual operation environment, operating voltage and threshold voltage fluctuate due to changing temperature of the semiconductor device or power source condition. In this way, the conditions in actual operation are much different from the conditions in the manufacturing process. Therefore, since testing is not performed under actual operation conditions, the reliability of the semiconductor device may be decreased.

SUMMARY OF THE INVENTION

Accordingly, an object of this invention is to provide a novel semiconductor device, having a wide operation range, capable of assuring its operation under fluctuations occurring in an actual operation environment.

The present invention includes an internal circuit to be tested, a redundancy circuit used when repairing a defective part in the internal circuit, a switching unit connected to the internal circuit and the redundancy circuit, wherein the switching unit switches wiring in order to ensure proper operation of the semiconductor, a test unit connected to the internal circuit, wherein the test unit performs testing for the internal circuit, and an operation environment change unit connected to the internal circuit, wherein the operation environment change unit changes environment of the internal circuit when the test unit performs testing.

According to principles of the present invention, semiconductor devices can be tested under the actual environment so that a defective part can be repaired under the actual operation environment. Moreover, it is possible to widen the range of guaranteed operation of semiconductor devices when a plurality of tests are performed under a plurality of operation environments. For example, tests can be performed under the condition that the semiconductor generates heat, like in the actual operation environment, if the tests are performed under a plurality of voltages.

BRIEF DESCRIPTION OF THE DRAWINGS

The objects, features, and advantages of the present invention will become more apparent from the following description of a preferred embodiment taken in conjunction with the accompanying drawings, in which.

DETAILED DESCRIPTION OF THE EMBODIMENTS

Figure 1:
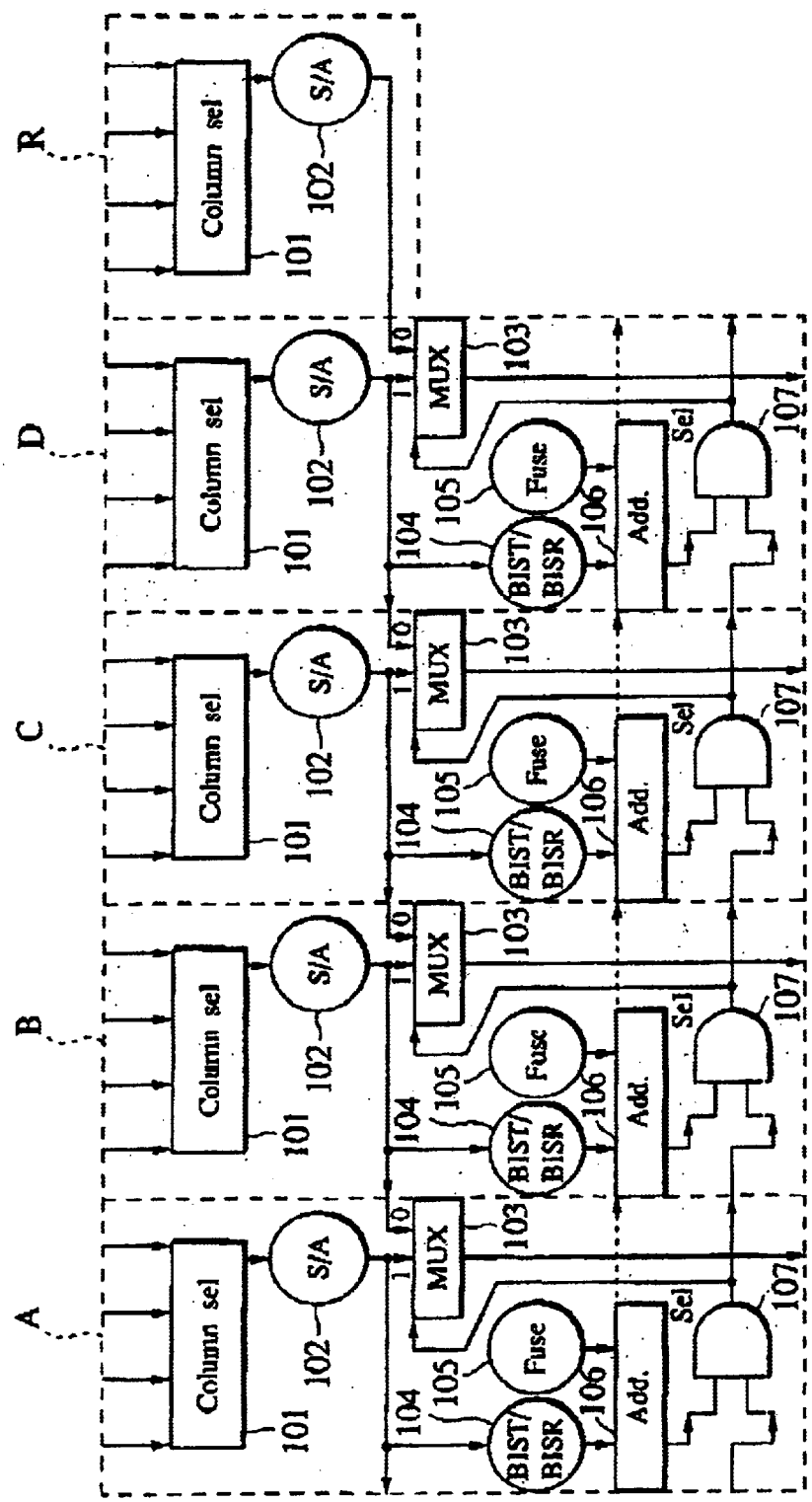
FIG. 1 is a block diagram showing a column cell array connected to a memory cell array according to related art.

Various embodiments of the present invention will be described with reference to the accompanying drawings. It is to be noted that same or similar reference numerals are applied to same or similar parts and elements throughout the drawings, and the description of the same or similar parts and elements will be omitted or simplified.

Figure 2:
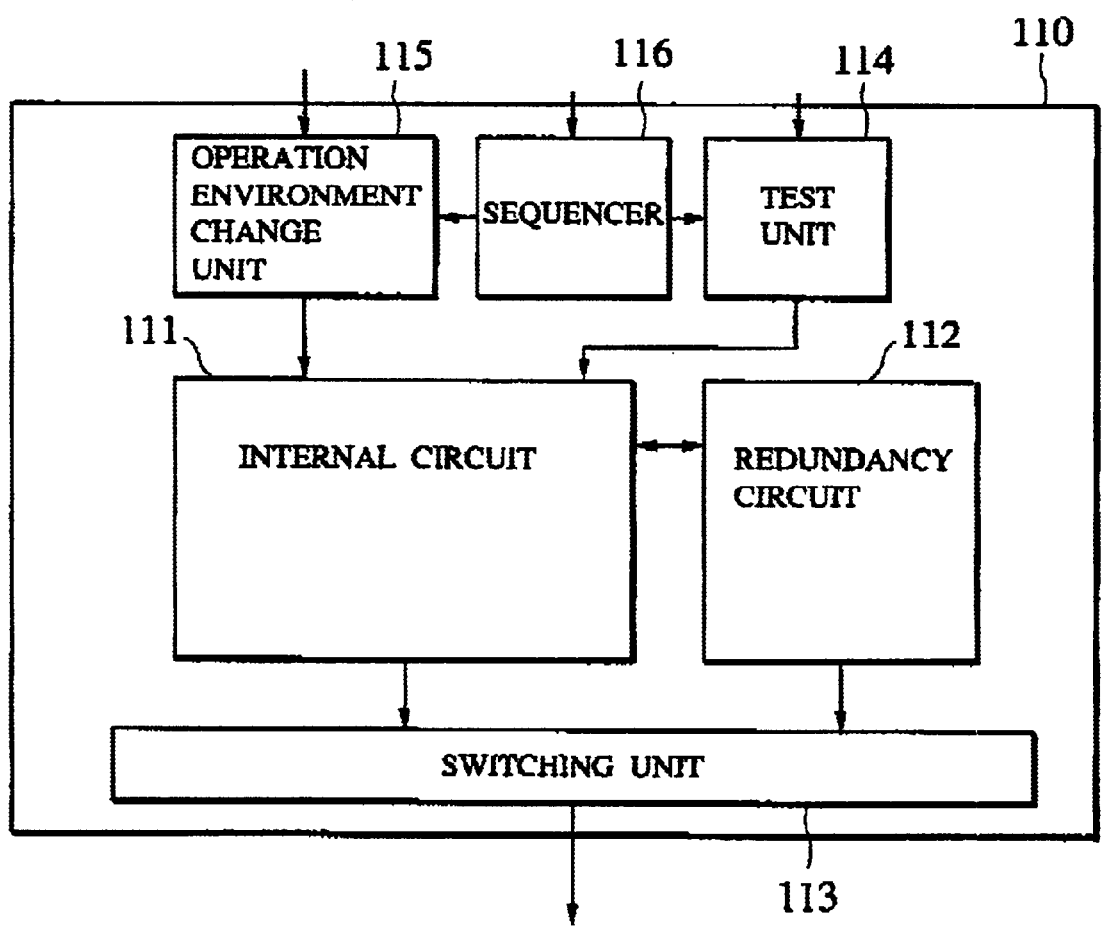
FIG. 2 is a block diagram showing a semiconductor device according to an embodiment of the present invention.

FIG. 2 is a block diagram showing a semiconductor device 110 according to an embodiment of the present invention. The semiconductor comprises an internal circuit 111 to be tested, a redundancy circuit used when repairing a defective part in the internal circuit 111, and a switching unit for switching wiring for proper operation of the semiconductor 111. The semiconductor 111 further comprises a test unit for testing the internal circuit 111, and an operation environment change unit 115 for changing an environment of the semiconductor 110 when testing. Furthermore, the semiconductor comprises a sequencer 116 for controlling the test unit 114 and the operation environment change unit 115.

The internal circuit 111 includes every semiconductor circuit such as a memory or a processor. In the example of the memory according to the related art of FIG. 1, the internal circuit 111 includes each column selector 101 of cell columns A–D.

The redundancy circuit 112 is used when repairing a defective part in the internal circuit 111. In the example of the memory according to a related art of FIG. 1, the redundancy circuit 112 includes cell column R.

The switching unit 113 switches wiring to ensure proper operation of semiconductor 111. That is, switching unit 113 changes wiring connected to a defective part with a redundancy circuit. Referring to FIG. 1, in the event the test of BIST/BISR circuit 104 detects column cell B as a defective part, fuse 105 of column cell B is blown out and MUX 103 of column cell B selects an output of S/A 102 of column cell C by inputting a signal (sel) outputted by AND circuit 107 of column cell B. Similarly, MUX 103 of column cell C selects an output of S/A 102 of column cell D by inputting a signal (sel) outputted by AND circuit 107 of column cell C. The MUX 103 of column cell D selects an output of S/A 102 of the redundancy column cell R by inputting a signal (sel) outputted by AND circuit 107 of column cell D. By switching the output of a defective column cell to the output of a neighboring column cell and then shifting in order, column cells A–D can operate properly. Such a mechanism corresponds to the switching unit 113.

Figure 3:
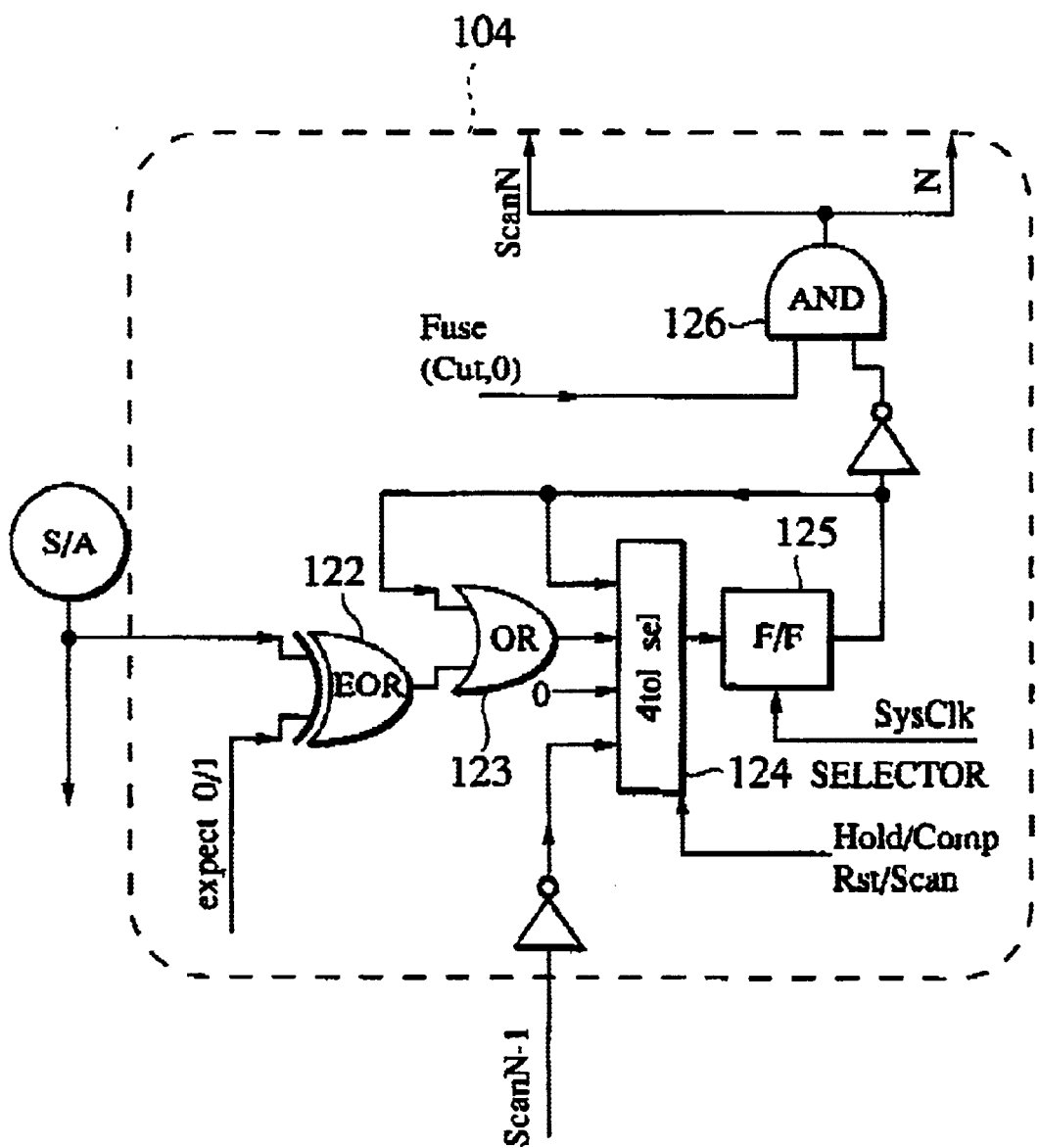
FIG. 3 is a block diagram showing a test unit according to an embodiment of the present invention.

The test unit 114 tests the internal circuit 111 and includes BIST/BISR 104 in FIG. 1. FIG. 3 is a block diagram showing a test unit according to an embodiment of the present invention. BIST/BISR 104 comprises the elements within the illustrated dashed line. BISR/BISR 104 comprises an EOR 122 for receiving data from an S/A and an expected value and comparing the data and the value to output comparison results, an OR 123 for accumulating the comparison results outputted by the EOR 122, a selector (4 to 1 sel) 124 for receiving the output signal from the OR 123 and outputting signals based on signals (Hold/Comp, Rst/Scan), a F/F (flip-flop) 125, and an AND 126 for changing a "defective" status to a "repaired" status.

The operation of BIST/BISR 104 will be explained below. The selector 124 is reset by receiving an Rst select signal so that the F/F125 is initialized. Next, BIST is performed to set the mode of the selector 124 "comparison (Comp)" by inputting the signal (Comp). The EOR 122 compares the output from S/A with the expected value. When the S/A output and the expected value are the same, the EOR 122 outputs "0". The EOR 122 outputs "1" when the output and expected value are not the same. The OR 123 receives the output of the EOR 122 and the output of F/F 125. The OR 123 will output the result of the comparison since the output of the F/F is "0" at the initialization state. That is to say, the OR 123 outputs "0" when its inputs are the same, and the OR 123 outputs "1" when the inputs are not the same. The selector 124 outputs the signal from the OR 123 since the selector 124 is set to "comparison (Comp)". Accordingly, when the output from S/A and the expect value are not the same, the OR 123 outputs "1", even if the output from S/A and the expect value are the same at the next comparison.

After BIST, the selector 124 is set to "scan" mode by receiving the signal (Scan), and the test results of each cell are scanned. It is possible to repair when the number of cells having outputs "1" is fewer than the number of redundancy circuits. However it is impossible to repair when the number of cells which outputs "1" is more than the number of redundancy circuits, in which case the semiconductor device is considered a defective product. At this point, the selector 124 is set to "hold" mode, to hold the data of the F/F 125, by receiving the signal (Hold). The held data specifies the column position to be repaired. After the column cell is repaired, the column cell status is set to "repaired" by outputting "0" due to setting fuse signal "0" output to AND 126. In this embodiment, if the fuse of each column cell comprises a logic circuit, the fuse can operate programmably.

The operation environment change unit 115 of FIG. 2 changes the environment of the semiconductor device during testing. Changing the operation environment includes a change in operation voltage, a change in operation frequency, a change in operation temperature, and a change in the timing of an input signal. The change in timing of an input signal includes all or partly delaying timing or forwarding timing of the input signals to the semiconductor. Moreover, changing input signal timing includes changing the various input timings of a plurality of input signals.

Figure 4:
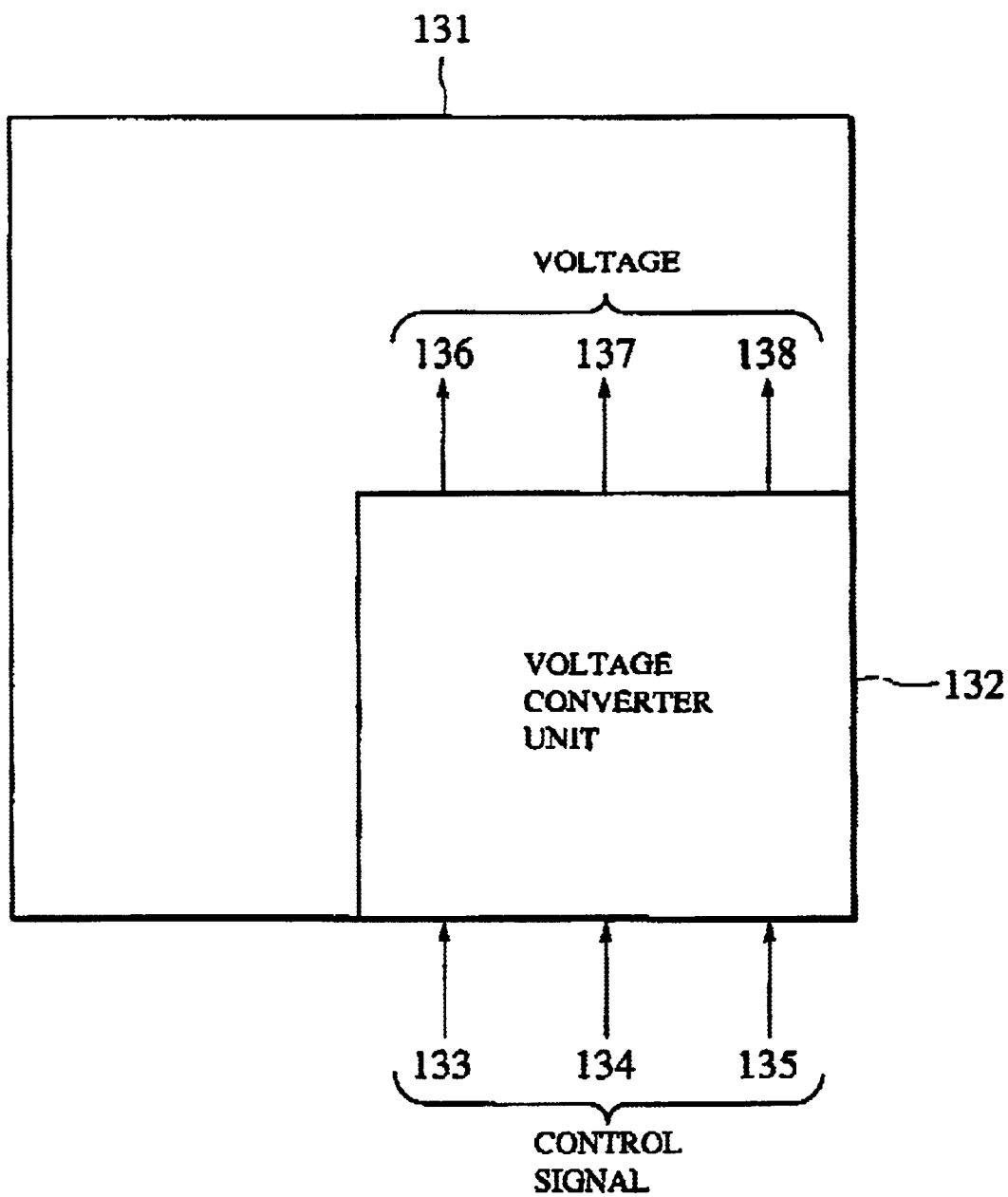
FIG. 4 is a block diagram explaining an example of an operating environment change unit according to an embodiment of the present invention.

FIG. 4 is a block diagram depicting an example of an operation environment change unit according to an embodiment of the present invention. The operation environment change unit has a voltage converter unit 132 to realize VOD (Voltage On Demand). The function of VOD will be explained below. The semiconductor device 131 has the voltage converter unit 132, which is different from a unit supplying multiple operating voltages from the outside. The voltage converter unit 132 outputs operation voltages 136–138 based on control signal 133–135. Accordingly, it is possible that multiple operating voltages are provided by supplying one standard voltage from the outside. The voltage converter unit 132 can be used for an LSI comprising an analog circuit and a digital circuit. Generally, an analog circuit requires higher voltage than a digital circuit. Thus, a plurality of operation voltages are required in an LSI which has an analog circuit and a digital circuit, such as high operation voltage for an analog circuit and low operation voltage for a digital circuit. The system that uses and controls multiple voltages in an LSI is indispensable for satisfying high speed demands and demands of power consumption saving, and it is the most remarkable technique in the power consumption saving technology. The U.S. application Ser. No. 09030737 filed Feb. 25, 1998 refers to the detailed explanation of the VOD.

During BIST execution, multiple operating voltages are set in the voltage converter unit programmably, and test results in each voltage are inputted to the BIST/BISR circuit.

Semiconductor device 110 may have all of the above-mentioned elements mounted on a single chip. Further, internal circuits 111, redundancy circuit 112 and switching circuit 113 can be mounted in the one-chip, and other operation environmental change unit 115 and test unit 114, etc. can be mounted on a different chip. A semiconductor system including the above-mentioned elements may be realized in order to connect these chips electrically.

Figure 5:
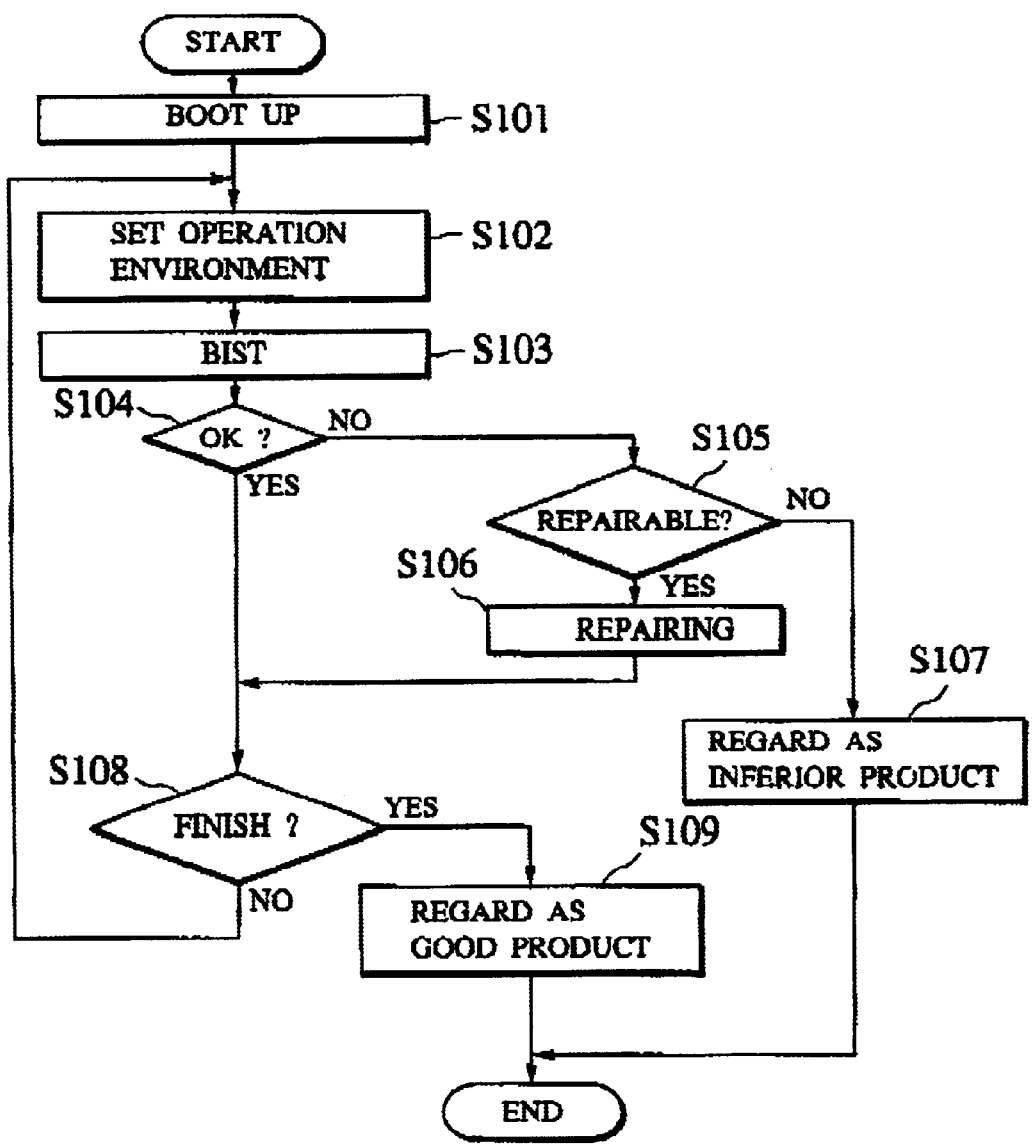
FIG. 5 is a flow chart illustrating a basic process of BISR according to an embodiment of the present invention.

Next, the processing of BISR for the memory chip will be explained. FIG. 5 is a flowchart showing a basic process of BISR according to an embodiment of the present invention. First of all, the memory chip may boot up (step 101) and an operation environment may be set (step 102). Setting an operation environment involves setting operation voltages, operation frequency, operating temperatures, and setting the input timing of the signal in the operation, etc. Next, BIST is performed (step 103), which includes initializing the circuit inside, inputting the test vector and comparison, and accumulating the test results. Next, whether the result of BIST is good or defective is decided (step 104). Then, if the result is "defective," whether the memory chip is repairable or not is decided (step 105). If the memory chip is repairable, then it is repaired (step 106). If it is determined to be unrepairable at step 105, then the memory chip is considered a defective product and the test is not carried out (steps 107). If the result of BIST is good, or if the repair was carried out in step 106, it is decided whether testing is complete (step 108) by comparing the number of tests to a predetermined number. If the number of tests has not reached the predetermined number, then the operation environment is set to perform BIST again. On the other hand, if the number of tests reaches the predetermined number in step 108, then the memory chip is considered a good product and the processing of BISR is ended (step 109).

Figure 6:
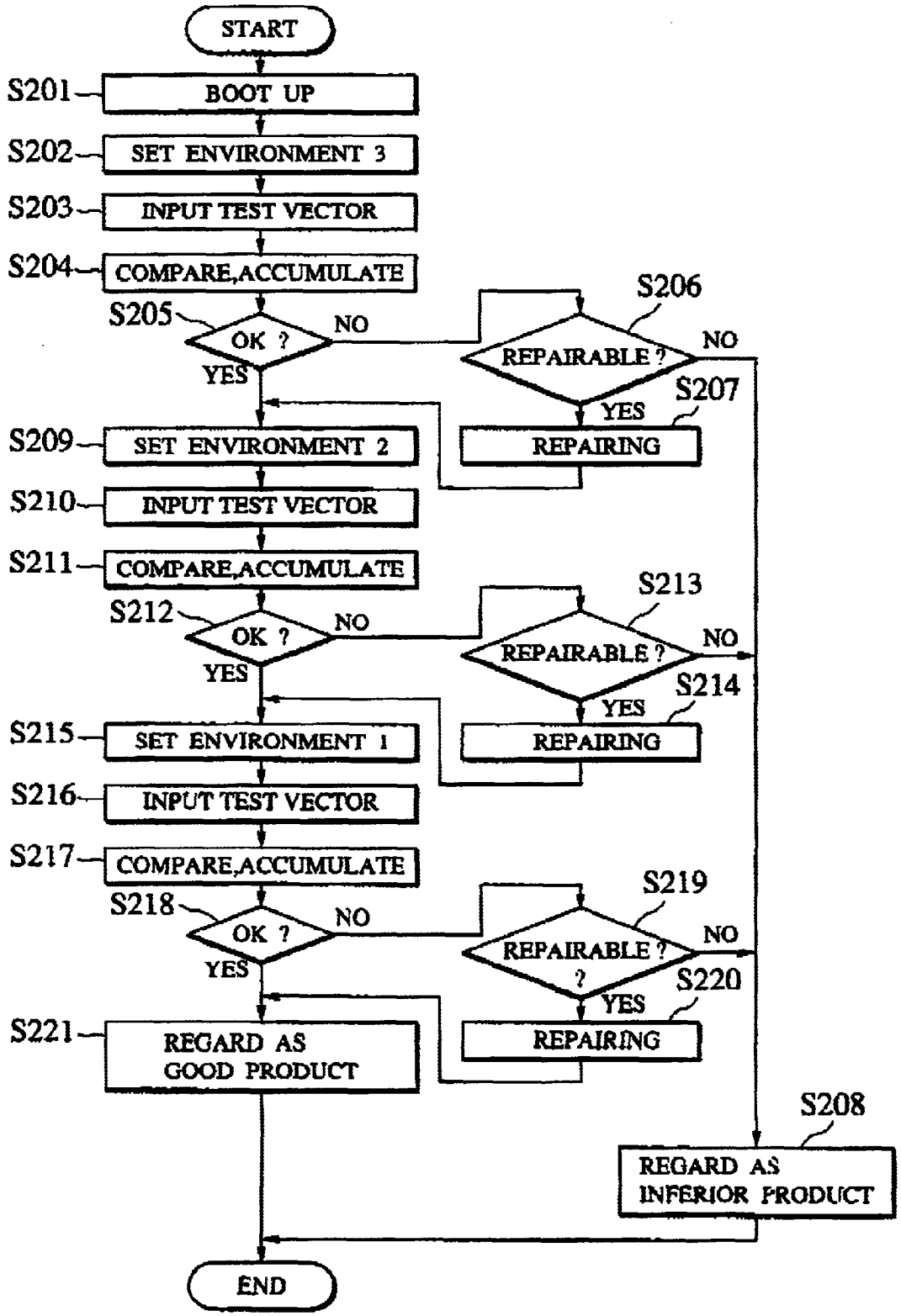
FIG. 6 is a flow chart illustrating a process of setting three operating environments according to an embodiment of the present invention.

FIG. 6 is a flow chart illustrating a process in which three operating environments are set according to an embodiment of the present invention. In this example, three operation voltages are set programmably as an operation environment. For example, there may be a voltage relation: voltage 3 (136)<voltage 2 (137)<voltage 1 (138). That is, voltage 3 is lower than voltage 2, and voltage 2 is lower than voltage 1. First of all, the memory chip is booted up (step 201) and the voltage 3 is set (setup 202). Next, the test vector is inputted (step 203). Next, BIST is performed, the results of BIST are compared with the expected value, and the results are accumulated (step 204). After BIST, whether the result of BIST is good or not is decided based on the output of BIST (step 205). The memory should pass in BISR under voltage 3 if it was determined to be "OK" in step 205. On the other hand, whether it is repairable or not is decided (step 206) if it was determined to be defective, that is to say, the defective part is detected in step 205. At this point, the number of defective parts and the number of redundancy circuits are compared. If the number of defective parts is fewer than the number of the redundancy circuits, then the memory chip is considered repairable. However, if the number of defective parts is more than the number of redundancy circuits, then the memory chip is considered unrepairable.

If considered repairable at step 206, the defective part is repaired by replacing the defective column cell with the redundancy column cell (step 207). On the other hand, if the memory chip is considered unrepairable in step 206, then the memory chip is considered a defective product and BIST is not performed (step 208). Next, the steps of setting the voltage 2 to the memory chip that passes the BIST under the voltage 3 (step 209), initializing the BIST circuit, and then inputting a test vector (step 210) are performed. It should be noted that the initializing of the BIST circuit does not mean that the selector (4to1 sel) 124 selects reset signal (Rst) in FIG. 2, since the information regarding a defective part is erased at the resetting signal (Rst). Next, performing BIST to compare the results of BIST with the expected value and to accumulate the results (step 211) occurs. After BIST, whether the result of BIST is good or not is decided based on the output of BIST (step 212). The memory should pass in BISR under voltage 2 if it was determined to be "OK" in step 212. On the other hand, whether the memory is repairable or not is decided when decision 212 is no (step 213). At this point, the number of defective parts and the number of redundancy circuits are compared. If the number of defective parts is fewer than the number of the redundancy circuits, then the memory chip is considered repairable. If the number of defective parts is more than the number of the redundancy circuits, then the memory chip is considered unrepairable.

The defective part is repaired by replacing the defective column cell with the redundancy column cell, when considered repairable in step 213 (step 214). On the other hand, if the memory chip is considered unrepairable in step 213, then the memory chip is considered a defective product and BIST is not performed (step 208). Next, the steps of setting voltage 1 to the memory chip that passes BIST under voltage 2 (step 215), initializing the BIST circuit, and then inputting a test vector (step 216) are performed. Next, performing BIST to compare the result of BIST with the expected value and accumulating the results (step 217) occurs. After the BIST, whether the result of BIST is good or not is decided based on the output of BIST (step 218). The memory should pass in BISR under voltage 1 if it was determined to be "OK" in step 218. On the other hand, whether the memory is repairable or not is decided (step 219) if it was determined to be defective in step 218. At this point, the number of defective parts and the number of redundancy circuits are compared. If the number of defective parts is fewer than the number of the redundancy circuits, then the memory chip is considered repairable. If the number of defective parts is more than the number of the redundancy circuits, then the memory chip is considered unrepairable. The defective part is repaired by replacing the defective column cell with the redundancy column cell, when it was considered repairable in the step 219 (step 220). On the other hand, if the memory chip is considered unrepairable in step 219, then the memory chip is considered a defective product and BIST is not performed (step 208). Finally, after passing voltage 1, the memory chip is considered a good product (step 221).

In one embodiment of BISR, it is possible to widen the range of guaranteed operation of semiconductor devices, since BIST is performed under a plurality of operation environments. Therefore, it is possible to guarantee operation of semiconductor devices in a wide voltage range and, therefore, during fluctuations of the operating voltage under actual operation environments. Thus, the instant invention is not limited to BIST at a single operating voltage as is the related art. Also, it is possible that BISR can be performed under higher temperatures in order to perform BISR three times, that is BIST under the voltage 3, BIST under voltage 2, and BIST under voltage 1 Namely, the temperature of the chip for the test in BISR shown in FIG. 3 is higher at the time of BISR under voltage 1 than the temperature of the chip at the time of boot up, or the temperature of the chip at the time of BISR under voltage 3. Therefore, it is possible to realize a semiconductor device having high reliability, since the test is performed under severe conditions such as a fluctuated threshold voltage or operating voltage, corresponding to actual conditions. In addition, it is possible to perform the test at the highest operation voltage under the condition of highest chip temperature and lowest threshold voltage, if the test is performed in order from lower voltage to higher voltage. In addition, it is possible to realize the test with fewer circuits by using a voltage conversion unit for setting the operating voltage programmably. In one embodiment, BISR at three operating voltages is performed for the semiconductor device. It should, however, be understood that BISR is not limited to three operating voltages. In addition, the tests may be performed in the following fashion: voltage 1 then voltage 2 then voltage 3, where voltage 3<voltage 2<voltage 1; however, the correlation between the voltage magnitudes and the order of the voltages are not limited to this example. In addition, testing may be performed under voltage 1 and voltage 3, omitting voltage 2. Moreover, the guarantee of chip operation can be confirmed if BIST is performed under voltage 1, voltage 2, and voltage 3 again after repairing occurs.

Figure 7:
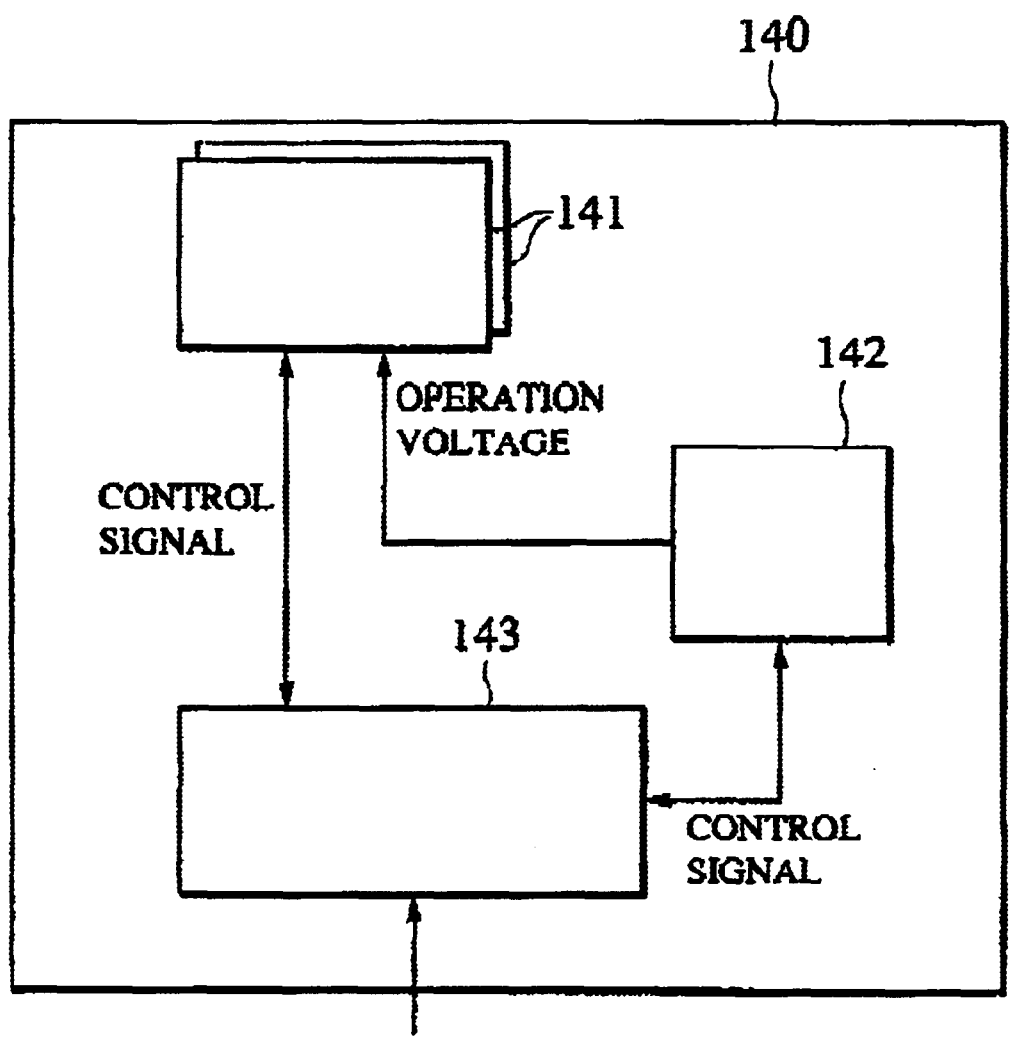
FIG. 7 is a block diagram showing a sequencer according to an embodiment of the present invention.

A semiconductor device according to another embodiment of the invention will now be explained. FIG. 7 is a block diagram showing a sequencer according to an embodiment of the present invention. The semiconductor device comprises a plurality of column cell arrays 141, a voltage conversion unit 142, and a sequencer 143. The semiconductor device 140 is mounted on the plurality of column cell arrays 141 such as a memory macro block having the BIST/BISR circuit shown in FIG. 3. The column cell array 141 is supplied voltage by the voltage converter 142, which could be a power supply unit. The sequencer 143 mounted in the semiconductor device 140 orders the voltage conversion unit 142 and BIST/BISR in the column cell array 141 to perform the processing diagrammatically illustrated in the flowchart of FIG. 6. For example, the sequencer 143 starts processing based on an instruction signal received from a boot ROM (not illustrated). BIST/BISR (not illustrated) mounted in the column cell array 141 and the voltage conversion unit 142 is controlled by the control signal output from sequencer circuit 143. Margin test and screening, in response to the environment of the system, can be performed at the time of system booting by preparing a program in the sequencer 143. In addition, it is possible that the reliability of the semiconductor devices is rapidly improved in order to screen an initial defect or an abrasion defect of a semiconductor device.

A reduction of the semiconductor device manufacturing cost can be realized due to the specification migration of the margin test, and the decreasing acceleration test such as a Burn-In test, etc.

Figure 8:
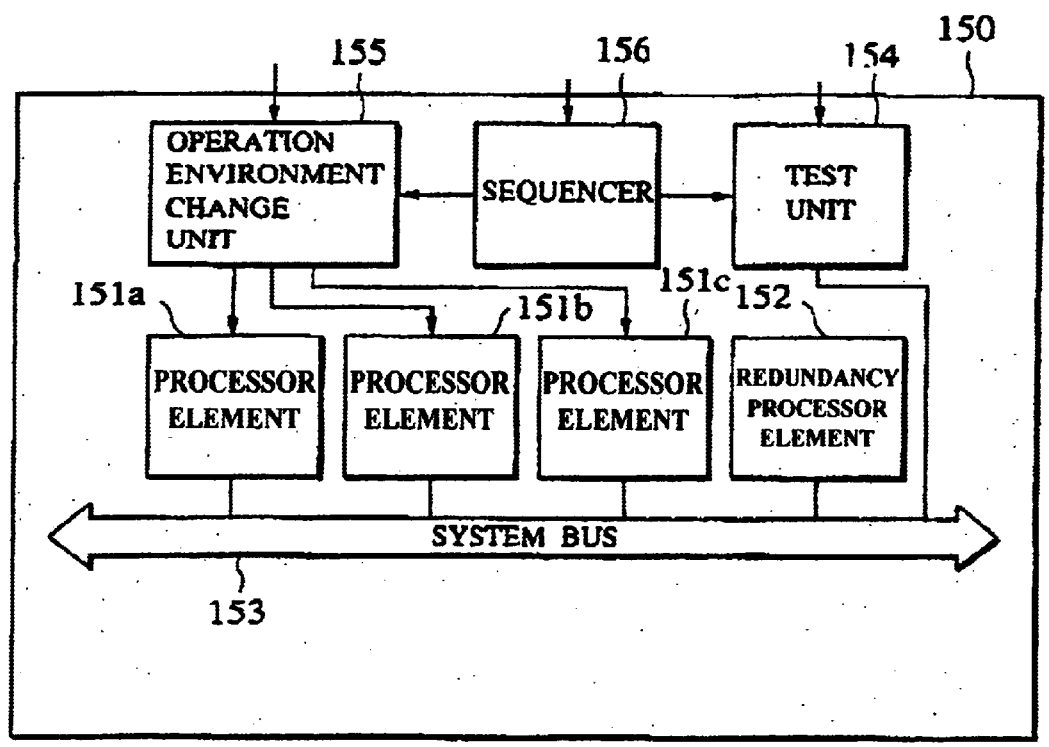
FIG. 8 is a block diagram showing a multi-processor according to an embodiment of the present invention.

FIG. 8 is a block diagram showing a multi-processor according to an embodiment of the present invention. The multi-processor 150 comprises a plurality of processor elements (P.E.) 151a, 151b, and 151c to be tested, redundancy P.E. 152 used when detecting a defective part of the P.E., a system bus for switching P.E. to ensure proper operation for the multi-processor 150. The multi-processor 150 further comprises a test unit 154 for testing P.E. 151a, 151b, and 151c, and an operation environment change unit 155 for changing an environment of the multi-processor 150 during testing. Furthermore, the multi-processor comprises a sequencer 156 for controlling the test unit 154 and the operation environment change unit 155. The test unit 154 outputs test data to each P.E. 151a–151c via system bus 153. Each P.E. 151a–151c performs processing of the test data and outputs the results of the processing to the test unit 154 via system bus 153. It is possible to determine whether each P.E. is good or defective based on the results of the processing. The redundancy P.E. 152 is used in the event that a defective part is detected. The operation environment change unit 155 changes operation environment, for example, changing clock frequency input to each P.E. During the test under a plurality of clock frequencies, some P.E.s cannot pass the test of the increasing clock frequency when the test is repeated. The limiting value is the operation frequency of each P.E. The value depends on each P.E. and may be different between the P.E.s. The test can be performed for P.E. 151a to 151c and redundancy P.E. 152 with increasing clock frequencies: a frequency A, a frequency B, and a frequency C (A<B<C). If only P.E. 151b cannot pass the test with frequency B, that frequency is the minimum frequency for each P.E. The repairing is then carried out by replacing the P.E. 151b with redundancy P.E. 152. For example, the switching is carried out in order to perform the communication in redundancy P.E. 152 and P.E. 151a via system bus 153, when P.E. 151b communicates with P.E. 151a. In this way, it is possible to improve the reliability of the multi-processor. Similarly, the repairing is carried out using redundancy P.E. 152, when only 151c fails the test with frequency C. For example, the switching is carried out in order to perform the communication in P.E. 151b and redundancy P.E. 152 via system bus 153 when P.E. 151b communicates with P.E. 151c. In this example, the multi-processor that could not operate at frequency B would be able to operate at the frequency C, and the operation speed can be improved. The operation environment is not limited to the frequency, the operation environment includes temperature and voltage, as above-mentioned. Also, the operation environment includes the timing of "setup" and "hold" signals input to each P.E.

In this way, according to this embodiment, it is possible to widen the guaranteed operation environment, such as operation voltage, because testing is performed under multiple operation environments. Therefore, it is possible to guarantee semiconductor device operation in a wide range and during fluctuations occurring under actual operation environments.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A semiconductor device having a self-repairing function, comprising:
   an internal circuit to be tested;
   a redundancy circuit it to replace a defective part in the internal circuit;
   a test unit, coupled to the internal circuit, for testing said internal circuit;
   a switching unit, coupled to the internal circuit and the redundancy circuit, configured to replace the defective part with the redundancy circuit when said defective part is detected by the test unit;
   a VOD (voltage on demand) unit, coupled to the internal circuit, configured to supply a plurality of operation voltages to the internal circuit during testing in order to change the environment of the internal circuit from within the semiconductor device; and
   a sequencer connected to the test unit and the VOD unit for controlling the test unit and the VOD unit.

2. The semiconductor device of claim 1, wherein the sequencer is operable to:
   order the VOD unit to set an operation voltage; and
   order the test unit to test the internal circuit under the operation voltage.

3. The semiconductor device of claim 1 wherein the test unit is operable to:
   (a) test the internal circuit under an operation voltage;
   (b) determine whether the internal circuit is defective based on results of said testing;

(c) determine whether the internal circuit is repairable; and (d) repair the internal circuit when said circuit is determined to be repairable.

4. The semiconductor device of claim 1, wherein the internal circuit, the redundancy circuit, and the switching unit are packaged in one chip, and the test unit and the VOD unit are packaged in another chip.

5. The semiconductor device of claim 1, wherein the internal circuit is a memory circuit.

6. The semiconductor device of claim 1, wherein the internal circuit is a processor.

7. The semiconductor device of claim 1, wherein the sequencer inputs a start signal at the time of system booting.

8. A semiconductor device having a self-repairing function, comprising:

an internal circuit to be tested;

a redundancy circuit to replace a defective part in the internal circuit;

a test unit, coupled to the internal circuit, for testing said internal circuit;

a switching unit, coupled to the internal circuit and the redundancy circuit, configured to replace the defective part with the redundancy circuit when said defective part is detected by the test unit;

an operation environment change unit, coupled to the internal circuit, configured to change an operation frequency of the internal circuit during testing in order to change an environment of the internal circuit from within the semiconductor device; and a sequencer connected to the test unit and the operation environment change unit for controlling the test unit and the operation environment change unit.

9. The semiconductor device of claim 8, wherein the sequencer is operable to:

order the operation environment change unit to set an operation frequency; and order the test unit to test the internal circuit under the operation frequency.

10. The semiconductor device of claim 8, wherein the operation environment change unit outputs a plurality of frequencies.

11. The semiconductor device of claim 8, wherein the test unit is operable to:

(a) test the internal circuit under an operation frequency after changing the operation frequency;

(b) determine whether the internal circuit is defective based on results of said testing;

(c) determine whether the internal circuit is repairable; and (d) repair the internal circuit when said circuit is determined to be repairable.

12. The semiconductor device of claim 8, wherein the internal circuit, the redundancy circuit, and the switching unit are packaged in one chip, and the test unit and the operation environment change unit are packaged in another chip.

13. A semiconductor device having a self-repairing function, comprising:

an internal circuit to be tested;

a redundancy circuit to replace a defective part in the internal circuit;

a test unit, coupled to the internal circuit, for testing the internal circuit;

a switching unit, coupled to the internal circuit and the redundancy circuit, configured to replace the defective part with the redundancy circuit when said defective part is detected by the test unit;

an operation environment change unit, coupled to the internal circuit, configured to change a timing of an input signal to the internal circuit during testing in order to change an environment of the internal circuit from within the semiconductor device; and a sequencer connected to the test unit and the operation environment change unit for controlling the test unit and the operation environment change unit.

14. The semiconductor device of claim 13, wherein the sequencer is operable to:

order the operation environment change unit to set the timing of the input signal to the internal circuit; and order the test unit to test the internal circuit under the timing of the input signal to the internal circuit.

15. The semiconductor device of claim 13, wherein the operation environment change unit changes a plurality of timings of the input signal to the internal circuit.

16. The semiconductor device of claim 13, wherein the test unit is operable to:

(a) test the internal circuit under a timing of an input signal to the internal circuit;

(b) determine whether the internal circuit is defective based on results of said testing;

(c) determine whether the internal circuit is repairable; and (d) repair the internal circuit when said circuit is determined to be repairable.

17. The semiconductor device of claim 13, wherein the internal circuit, the redundancy circuit, and the switching unit are packaged in one chip, and the test unit and the operation environment change unit are packaged in another chip.

18. A semiconductor device having a self-repairing function, comprising:

an internal circuit to be tested;

at least one redundancy circuit to replace at least one defective part in the internal circuit;

a voltage conversion means, residing within the semiconductor device, for receiving a voltage from an external source and providing N (N=1, 2, . . . n) operation voltages programmably via at least one control signal;

a test means for determining whether the internal circuit is defective under each of the N operation voltages;

a switching means for replacing the at least one defective part in the internal circuit with the at least one redundancy circuit, when the at least one defective part is detected by the test means; and a sequencer for:

ordering the voltage conversion means to set M (M is equal or less than N) operation voltages;

ordering the test means to test the internal circuit under the M operation voltages;

determining whether the internal circuit is defective;

determining whether the number of defective parts is less than the number of redundancy circuits; and ordering the switching means to replace the defective part with the redundancy circuit.

19. The semiconductor device of claim 18, wherein the sequencer starts to operate when the system boots.

20. The semiconductor device of claim 18, wherein the sequencer orders the voltage conversion means to set M operation voltages arranged in an ascending order of voltage magnitudes.

21. A semiconductor device having a self-repairing function, comprising:

an internal circuit to be tested;

at least one redundancy circuit to replace at least one defective part in the internal circuit;

a frequency conversion means, residing within the semiconductor device, for setting N (N=1, 2, . . . n) operation frequencies programmably based on a control signal;

a test means for determining whether the internal circuit is defective under each of the N operation frequencies;

a switching means for replacing the at least one defective part in the internal circuit with the at least one redundancy circuit, when the at least one defective part is detected by the test means; and a sequencer for:
ordering the frequency conversion means to set M (M is equal or less than N) operation frequencies;
ordering the test means to test the internal circuit under the M operation frequencies;
determining whether the internal circuit is defective;
determining whether the number of defective parts is less than the number of redundancy circuits; and
ordering the switching means to replace the defective part with the redundancy circuit.

* * * * *